(12) United States Patent
Park (10) Patent No.: US 9,711,242 B2
(45) Date of Patent: Jul. 18, 2017

(54) REPAIR DEVICE

(71) Applicant: SK hynix Inc., Icheon-si Gyeonggi-do (KR)

(72) Inventor: Min Su Park, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/062,434

(22) Filed: Mar. 7, 2016

(65) Prior Publication Data

US 2017/0084352 A1    Mar. 23, 2017

(30) Foreign Application Priority Data

Sep. 18, 2015  (KR) .......................... 10-2015-0132539

(51) Int. Cl.
| | | |
|---|---|---|
| G11C 7/00 | (2006.01) | |
| G11C 29/44 | (2006.01) | |
| G11C 11/4091 | (2006.01) | |
| G11C 17/16 | (2006.01) | |

(52) U.S. Cl.
CPC .......... *G11C 29/44* (2013.01); *G11C 11/4091* (2013.01); *G11C 17/16* (2013.01)

(58) Field of Classification Search
CPC ...... G11C 29/44; G11C 11/4091; G11C 17/16
USPC ................... 365/200, 230.03, 185.2
See application file for complete search history.

(56) References Cited

U.S. PATENT DOCUMENTS

| | | | |
|---|---|---|---|
| 4,727,516 A | 2/1988 | Yoshida et al. | |
| 6,397,313 B1 * | 5/2002 | Kasa ..................... | G11C 29/781 365/200 |
| 6,532,181 B2 | 3/2003 | Saito et al. | |
| 6,657,907 B2 | 12/2003 | Lee | |
| 7,313,036 B2 | 12/2007 | Kim | |
| 8,102,689 B2 | 1/2012 | Hong et al. | |
| 2001/0005335 A1 * | 6/2001 | Hwang ................... | G11C 17/16 365/225.7 |
| 2004/0218431 A1 * | 11/2004 | Chung ................. | G11C 29/783 365/200 |
| 2005/0207244 A1 * | 9/2005 | Takenaka ............... | G11C 29/82 365/200 |
| 2005/0232036 A1 * | 10/2005 | Choi ....................... | G11C 8/12 365/200 |

(Continued)

FOREIGN PATENT DOCUMENTS

| | | |
|---|---|---|
| KR | 100876807 B1 | 1/2009 |
| KR | 1020100053203 A | 5/2010 |
| KR | 1020140001483 A | 1/2014 |

*Primary Examiner* — Viet Q Nguyen
(74) *Attorney, Agent, or Firm* — William Park & Associates Ltd.

(57) ABSTRACT

A repair device may be provided. The repair device may include a selection controller configured to control an upper select signal and a lower select signal in correspondence to a fail address and an upper signal and a lower signal which represent a failed region of each mat. The repair device may include a driving controller configured to selectively control a selection control signal in correspondence to the upper select signal and the lower select signal. The repair device may include a bank configured to selectively couple local input/output lines and a sensing circuit of a corresponding mat in correspondence to the selection control signal, and may replace and repair a failed cell of a normal mat with a dummy cell of an upper mat or a lower mat in correspondence to a column select signal.

20 Claims, 7 Drawing Sheets

(56) References Cited

U.S. PATENT DOCUMENTS

| | | | |
|---|---|---|---|
| 2006/0007739 A1* | 1/2006 | Takeda | G11C 29/44 |
| | | | 365/185.09 |
| 2006/0233014 A1* | 10/2006 | Oh | G11C 29/808 |
| | | | 365/154 |
| 2007/0030743 A1* | 2/2007 | Kim | G11C 29/808 |
| | | | 365/200 |
| 2009/0116318 A1* | 5/2009 | Kuroda | G11C 7/08 |
| | | | 365/200 |
| 2010/0290297 A1* | 11/2010 | Kyung | G11C 29/816 |
| | | | 365/200 |
| 2013/0016572 A1* | 1/2013 | Kuroda | G11C 11/419 |
| | | | 365/189.05 |
| 2015/0228352 A1* | 8/2015 | Choi | G11C 29/76 |
| | | | 365/185.2 |

* cited by examiner

REPAIR DEVICE

CROSS-REFERENCES TO RELATED APPLICATION

The present application claims priority under 35 U.S.C. §119(a) to Korean Patent Application No. 10-2015-0132539, filed on Sep. 18, 2015, in the Korean Intellectual Property Office, which is incorporated herein by reference in its entirety.

BACKGROUND

1. Technical Field

Various embodiments generally relate to a repair device, and more particularly, to a technology for utilizing cells of dummy mats as redundancies.

2. Related Art

A DRAM (dynamic random access memory) is constructed by a plurality of memory cells. The memory cells are arranged in the form of a matrix. If a fail occurs even in one of the memory cells among a plurality of memory cells, a semiconductor memory device is identified as a bad product since it cannot properly perform an operation. The probability of a failed cell occurring increases with semiconductor memory devices having high integration and performing high speed operations.

Therefore, a yield is likely to decrease. The yield may be defined as the ratio of the number of good chips to the total number of chips and serves to determine a manufacturing cost. Thus, studies are actively being made for not only a method for high integration and high speed operation of a semiconductor memory device but also a method for efficiently repairing a failed cell in an effort to increase a yield.

As a method for repairing a failed cell, a technology of disposing a repair circuit for replacing a failed cell with a redundancy cell is being used. In general, a repair circuit includes redundancy columns/rows which are arranged into columns and rows each constructed by redundancy memory cells. A redundancy column/row is selected instead of a column/row in which a fail has occurred.

That is to say, if a row and/or column address signal which designates a failed cell is inputted, a redundancy column/row is selected instead of a failed column/row of a normal memory cell bank or memory cell bank which has not failed. Generally, in order to represent an address which designates a failed cell, a plurality of fuses to be cut are disposed. The address of the failed cell is programmed as the plurality of fuses are selectively cut.

SUMMARY

Various embodiments may be directed to utilizing cells of dummy mats as redundancies.

In an embodiment, a repair device may be provided. The repair device may include a selection controller configured to control an upper select signal and a lower select signal in correspondence to a fail address and an upper signal and a lower signal which represent a failed region of each mat. The repair device may include a driving controller configured to selectively control a selection control signal in correspondence to the upper select signal and the lower select signal. The repair device may include a bank configured to selectively couple local input/output lines and a sensing circuit of a corresponding mat in correspondence to the selection control signal, and replace and repair a failed cell of a normal mat with a dummy cell of an upper mat or a lower mat in correspondence to a column select signal.

According to the embodiment, by utilizing cells of dummy mats as redundancies, it may be possible to increase a yield.

DETAILED DESCRIPTION

Hereinafter, a repair device will be described below with reference to the accompanying drawings through various examples of embodiments.

Figure 1:
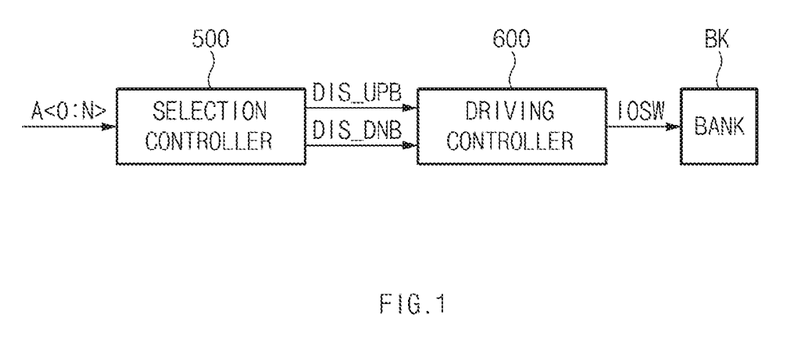
FIG. 1 is a circuit diagram illustrating a representation of an example of a repair device in accordance with an embodiment.

FIG. 1 is a configuration diagram illustrating a representation of an example of a repair device in accordance with an embodiment.

The repair device in accordance with an embodiment may include a selection controller 500, a driving controller 600, and a bank BK.

The selection controller 500 generates an upper select signal DIS_UPB and a lower select signal DIS_DNB for selecting upper and lower mats in the bank BK. The selection controller 500 outputs the upper select signal DIS_UPB and the lower select signal DIS_DNB to the driving controller 600 in correspondence to a normal address A<0:N>.

The driving controller 600 selectively controls enable states of a plurality of selection control signals IOSW in correspondence to the upper select signal DIS_UPB and the lower select signal DIS_DNB. The bank BK selectively enables corresponding mats in correspondence to the plurality of selection control signals IOSW.

Figure 2:
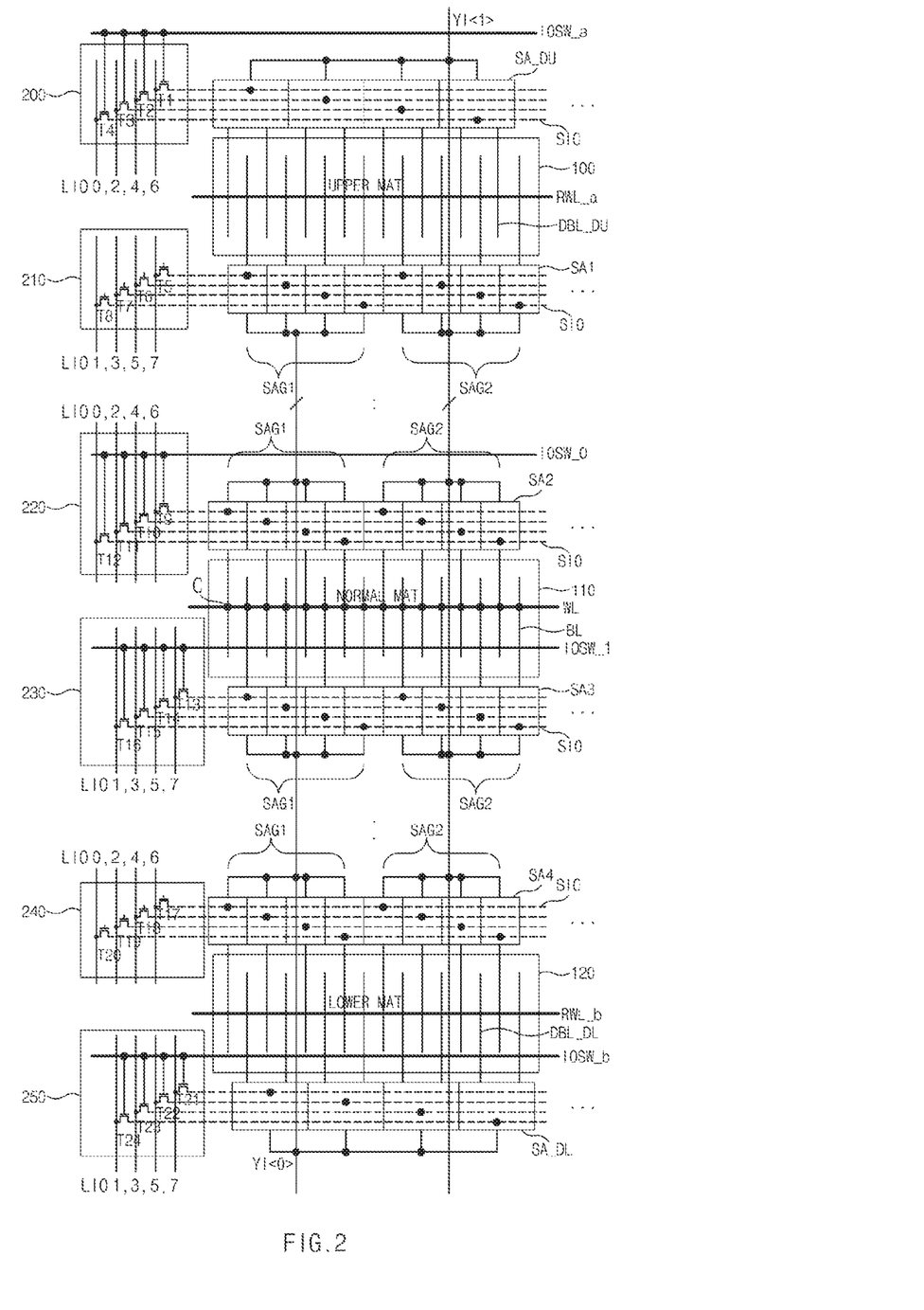
FIG. 2 is a diagram illustrating a representation of an example of the bank illustrated in FIG. 1.

FIG. 2 is a diagram illustrating a representation of an example of the bank BK illustrated in FIG. 1.

A semiconductor memory device is driven by being divided into a plurality of banks. Each of the plurality of banks includes a plurality of mats each of which is constructed by a plurality of memory cells. These mats are arranged in plural numbers in a row direction and a column direction, and form a plurality of mat rows (mat blocks) and a plurality of mat columns.

Referring to FIG. 2, in an embodiment, the bank BK may include a normal mat 110, an upper mat 100, a lower mat 120, a plurality of sensing circuits SA1 to SA4, a plurality of dummy sensing circuits SA_DU and SA_DL, and a plurality of selection circuits 200 to 250.

The upper mat 100 is disposed over the normal mat 110, and the lower mat 120 is disposed under the normal mat 110.

The upper mat 100 and the lower mat 120 correspond to dummy mats which are formed adjacent to peripheral regions of the normal mat 110.

The plurality of sensing circuits SA1 to SA4 are disposed respectively between mats. For example, the sensing circuit SA1 is formed in a region lying under the upper mat 100, and includes a plurality of sense amplifiers. The sensing circuit SA2 is disposed over the normal mat 110, and includes a plurality of sense amplifiers. The sensing circuit SA3 is disposed under the normal mat 110, and includes a plurality of sense amplifiers. The sensing circuit SA4 is formed in a region lying over the lower mat 120, and includes a plurality of sense amplifiers.

It is described in the present embodiment, for the sake of convenience in explanation, that each of the sensing circuits SA2 and SA3 includes 8 sense amplifiers. However, the embodiments are not limited to such, and it is to be noted that each of the sensing circuits SA2 and SA3 may include, for example, 512 sense amplifiers to have a bank structure in which total 1K number of sense amplifiers are disposed.

It is set as a reference that 4 segment input/output lines SIO are disposed for the one sensing circuit SA2 and 4 segment input/output lines SIO are disposed for the one sensing circuit SA3. In the sensing circuits SA2 and SA3, 128 sense amplifiers may be coupled with each one segment input/output line SIO.

The dummy sensing circuit SA_DU is formed in a region lying over the upper mat 100, and includes a plurality of dummy sense amplifiers. The dummy sensing circuit SA_DL is formed in a region lying under the lower mat 120, and includes a plurality of dummy sense amplifiers.

The plurality of selection circuits 200 to 250 selectively couple local input/output lines LIO and segment input/output lines SIO by the selection control signals IOSW.

The selection circuits 200, 220 and 240 couple even local input/output lines LIO0, LIO2, LIO4 and LIO6 (i.e., LIO 0, 2, 4, 6) and segment input/output lines SIO. The selection circuits 210, 230 and 250 couple odd local input/output lines LIO1, LIO3, LIO5 and LIO7 (i.e., LIO 1, 3, 5, 7) and segment input/output lines SIO.

The selection circuit 200 couples selectively even local input/output lines LIO0, LIO2, LIO4 and LIO6 and the dummy sensing circuit SA_DU by a selection control signal IOSW_a. The selection circuit 200 may include a plurality of switching elements T1 to T4. The plurality of switching elements T1 to T4 are coupled between the even local input/output lines LIO0, LIO2, LIO4 and LIO6 and the segment input/output lines SIO of the dummy sensing circuit SA_DU, and are applied with the selection control signal IOSW_a through the gate terminals thereof.

The selection circuit 250 couples selectively odd local input/output lines LIO1, LIO3, LIO5 and LIO7 and the dummy sensing circuit SA_DL by a selection control signal IOSW_b. The selection circuit 250 may include a plurality of switching elements T21 to T24. The plurality of switching elements T21 to T24 are coupled between the odd local input/output lines LIO1, LIO3, LIO5 and LIO7 and the segment input/output lines SIO of the dummy sensing circuit SA_DL, and are applied with the selection control signal IOSW_b through the gate terminals thereof.

The selection circuit 220 couples selectively even local input/output lines LIO0, LIO2, LIO4 and LIO6 and the sensing circuit SA2 by a selection control signal IOSW_0. The selection circuit 220 may include a plurality of switching elements T9 to T12. The plurality of switching elements T9 to T12 are coupled between the even local input/output lines LIO0, LIO2, LIO4 and LIO6 and the segment input/output lines SIO of the sensing circuit SA2, and are applied with the selection control signal IOSW_0 through the gate terminals thereof.

The selection circuit 230 couples selectively odd local input/output lines LIO1, LIO3, LIO5 and LIO7 and the sensing circuit SA3 by a selection control signal IOSW_1. The selection circuit 230 may include a plurality of switching elements T13 to T16. The plurality of switching elements T13 to T16 are coupled between the odd local input/output lines LIO1, LIO3, LIO5 and LIO7 and the segment input/output lines SIO of the sensing circuit SA3, and are applied with the selection control signal IOSW_1 through the gate terminals thereof.

In the upper mat 100, dummy cells are formed at points where a redundancy word line RWL_a and dummy bit lines DBL_DU intersect. Each one sense amplifier of the dummy sensing circuit SA_DU is coupled with 2 dummy bit lines DBL_DU. In the case where 2 dummy bit lines DBL_DU are coupled with each one sense amplifier, the number of sense amplifiers may be reduced in half when compared to a conventional structure.

In the lower mat 120, dummy cells are formed at points where a redundancy word line RWL_b and dummy bit lines DBL_DL intersect. Each one sense amplifier of the dummy sensing circuit SA_DL is coupled with 2 dummy bit lines DBL_DL. In the case where 2 dummy bit lines DBL_DL are coupled with each one sense amplifier, the number of sense amplifiers may be reduced in half when compared to the conventional structure.

In the normal mat 110, cells C are formed at points where a word line WL and bit lines BL intersect. Each one sense amplifier of the sensing circuit SA2 is coupled with one bit line BL. Similarly, each one sense amplifier of the sensing circuit SA3 is coupled with one bit line BL.

For example, the upper mat 100 is coupled with 4 sense amplifiers of the dummy sensing circuit SA_DU and is coupled with 8 sense amplifiers of the sensing circuit SA1. In other words, the dummy sensing circuit SA_DU which is coupled with the upper mat 100 has sense amplifiers the number of which corresponds to half the number of the sense amplifiers of the sensing circuit SA1. The lower mat 120 is coupled with 4 sense amplifiers of the dummy sensing circuit SA_DL and is coupled with 8 sense amplifiers of the sensing circuit SA4. In other words, the dummy sensing circuit SA_DL which is coupled with the lower mat 120 has sense amplifiers the number of which corresponds to half the number of the sense amplifiers of the sensing circuit SA4.

It was described in the present embodiment, for the sake of convenience in explanation, that the dummy sensing circuit SA_DU includes 4 sense amplifiers and the sensing circuit SA1 includes 8 sense amplifiers. However, the present embodiment is not limited to such, and it is to be noted that the dummy sensing circuit SA_DU may include 256 sense amplifiers and the sensing circuit SA1 may include double the number of sense amplifiers at 512. Since each one sense amplifier is coupled with 2 dummy bit lines DBL_DU in the upper mat 100, 256 sense amplifiers cannot help but be disposed in the upper mat 100. In an embodiment, the dummy sensing circuit SA_DU may include a number of sense amplifiers and the sensing circuit SA1 may include double the number of sense amplifiers. However, the embodiments are not limited to the number of elements stated herein or to the examples of numbers stated within the disclosure. As such, there may be an embodiment where any numbers of dummy sensing circuits and sensing circuits including any number of sense amplifiers.

It is set as a reference that 4 segment input/output lines SIO are disposed for the one dummy sensing circuit SA_DU. In the dummy sensing circuit SA_DU, 64 sense amplifiers, for example, may be coupled to each one segment input/output line SIO.

Further, it was described in the present embodiment, for the sake of convenience in explanation, that the dummy sensing circuit SA_DL includes 4 sense amplifiers and the sensing circuit SA4 includes 8 sense amplifiers. However, the embodiments are not limited to such, and it is to be noted that the dummy sensing circuit SA_DL may include, for example but not limited to, 256 sense amplifiers and the sensing circuit SA4 may include, for example but not limited to, double the amount of sense amplifiers at 512. Since each one sense amplifier is coupled with 2 dummy bit lines DBL_DL in the lower mat 120, 256 sense amplifiers cannot help but be disposed in the lower mat 120.

It is set as a reference that 4 segment input/output lines SIO are disposed for the one dummy sensing circuit SA_DL. In the dummy sensing circuit SA_DL, for example, 64 sense amplifiers may be coupled to each one segment input/output line SIO.

A column select signal YI<0> selects column lines of the upper mat 100, the normal mat 110 and the lower mat 120. When the column select signal YI<0> is enabled, all sense amplifiers of the dummy sensing circuit SA_DL coupled with the lower mat 120 are selected, and half sense amplifier groups SAG1 of the sensing circuits SA1 to SA4 are selected. The column select signal YI<0> is a select signal for repairing the odd local input/output lines LIO1, LIO3, LIO5 and LIO7.

Conversely, when a column select signal YI<1> is enabled, all sense amplifiers of the dummy sensing circuit SA_DU coupled with the upper mat 100 are selected, and half sense amplifier groups SAG2 of the sensing circuits SA1 to SA4 are selected. The column select signal YI<1> is a select signal for repairing the even local input/output lines LIO0, LIO2, LIO4 and LIO6.

For example, in the case where 128 sense amplifiers are coupled to each one segment input/output line SIO in the normal mat 110, 128 column select signals YI are needed. Conversely, in the case where 64 sense amplifiers are coupled to each one segment input/output line SIO in the upper mat 100 and the lower mat 120, 64 column select signals YI are needed. Namely, in the case of the upper mat 100 and the lower mat 120, every other one of the dummy bit lines DBL_DU and DBL_DL is coupled with an application line of a column select signal YI.

According to this fact, in the present embodiment, only half cells of the normal mat 110 may be repaired with dummy cells of the upper mat 100 or the lower mat 120 by the selection control signal IOSW_a or IOSW_b.

The operation of the repair device in accordance with the embodiment of FIG. 2, configured as mentioned above, will be described below.

First, in the case where a repair operation is not performed, the selection control signals IOSW_0 and IOSW_1 are enabled, and the selection control signals IOSW_a and IOSW_b are disabled. Accordingly, as the selection control signals IOSW_a and IOSW_b are disabled, the selection circuits 200 and 250 are turned off, and the data is not outputted through the sensing circuits SA_DU and SA_DL coupled with the upper mat 100 and the lower mat 120. As the selection control signals IOSW_0 and IOSW_1 are enabled, data of the normal mat 110 are sensed through the sensing circuits SA2 and SA3.

In the present embodiment, if a fail occurs in a normal word line WL of the normal mat 110, the corresponding word line WL in which a fail has occurred may be replaced with a redundancy word line RWL_a of the upper mat 100 or may be replaced with a redundancy word line RWL_b of the lower mat 120.

In an embodiment illustrated in FIG. 2, half the number of word lines WL in which fails have occurred are replaced with redundancy word lines RWL_a or are replaced with redundancy word lines RWL_b.

For example, in a repair operation for the even local input/output lines LIO0, LIO2, LIO4 and LIO6, when the column select signal YI<1> is enabled, the selection control signal IOSW_0 is disabled. Then, the sensing circuit SA2 coupled with the normal mat 110 is turned off. The selection control signal IOSW_1 is enabled, and the sensing circuit SA3 coupled with the normal mat 110 is turned on.

Accordingly, 4 sense amplifiers of the sense amplifier group SAG2 are selected. In order to output 4 data, the 4 sense amplifiers are enabled in the sense amplifier group SAG2 coupled with the normal mat 110. That is to say, data is sensed from the sense amplifier group SAG2 of the sensing circuit SA3.

As the selection control signal IOSW_1 is enabled, the selection circuit 230 is turned on, and the data sensed from the sense amplifier group SAG2 are outputted to the odd local input/output lines LIO1, LIO3, LIO5 and LIO7 through the 4 segment input/output lines SIO.

Also, as the selection control signal IOSW_a is enabled, the selection circuit 200 is turned on, and the dummy sensing circuit SA_DU is turned on. Then, as the redundancy word line RWL_a of the upper mat 100 replaces the word line WL in which a fail has occurred, a repair operation for the word line WL corresponding to the even local input/output lines LIO0, LIO2, LIO4 and LIO6 is performed.

In other words, cells (for example, 4 cells) of an even word line of the normal mat 110 corresponding to the sensing circuit SA2 are replaced and repaired with dummy cells (for example, 4 cells) of the upper mat 100.

Conversely, in a repair operation for the odd local input/output lines LIO1, LIO3, LIO5 and LIO7, when the column select signal YI<0> is enabled, the selection control signal IOSW_1 is disabled. Then, the sensing circuit SA3 coupled to the normal mat 110 is turned off. The selection control signal IOSW_0 is enabled, and the sensing circuit SA2 coupled to the normal mat 110 is turned on.

Accordingly, 4 sense amplifiers of the sense amplifier group SAG1 are selected. In order to output 4 data, the 4 sense amplifiers are enabled in the sense amplifier group SAG1 coupled with the normal mat 110. Namely, data are sensed from the sense amplifier group SAG1 of the sensing circuit SA2.

As the selection control signal IOSW_0 is enabled, the selection circuit 220 is turned on, and the data sensed from the sense amplifier group SAG1 are outputted to the even local input/output lines LIO0, LIO2, LIO4 and LIO6 through the 4 segment input/output lines SIO.

As the selection control signal IOSW_b is enabled, the selection circuit 250 is turned on, and the dummy sensing circuit SA_DL is turned on. Then, as the redundancy word line RWL_b of the lower mat 120 replaces the word line WL in which a fail has occurred, a repair operation for the word line WL corresponding to the odd local input/output lines LIO1, LIO3, LIO5 and LIO7 is performed.

That is to say, cells (for example, 4 cells) of an odd word line of the normal mat 110 corresponding to the sensing circuit SA3 may be replaced and repaired with dummy cells (for example, 4 cells) of the lower mat 120.

Figure 3:
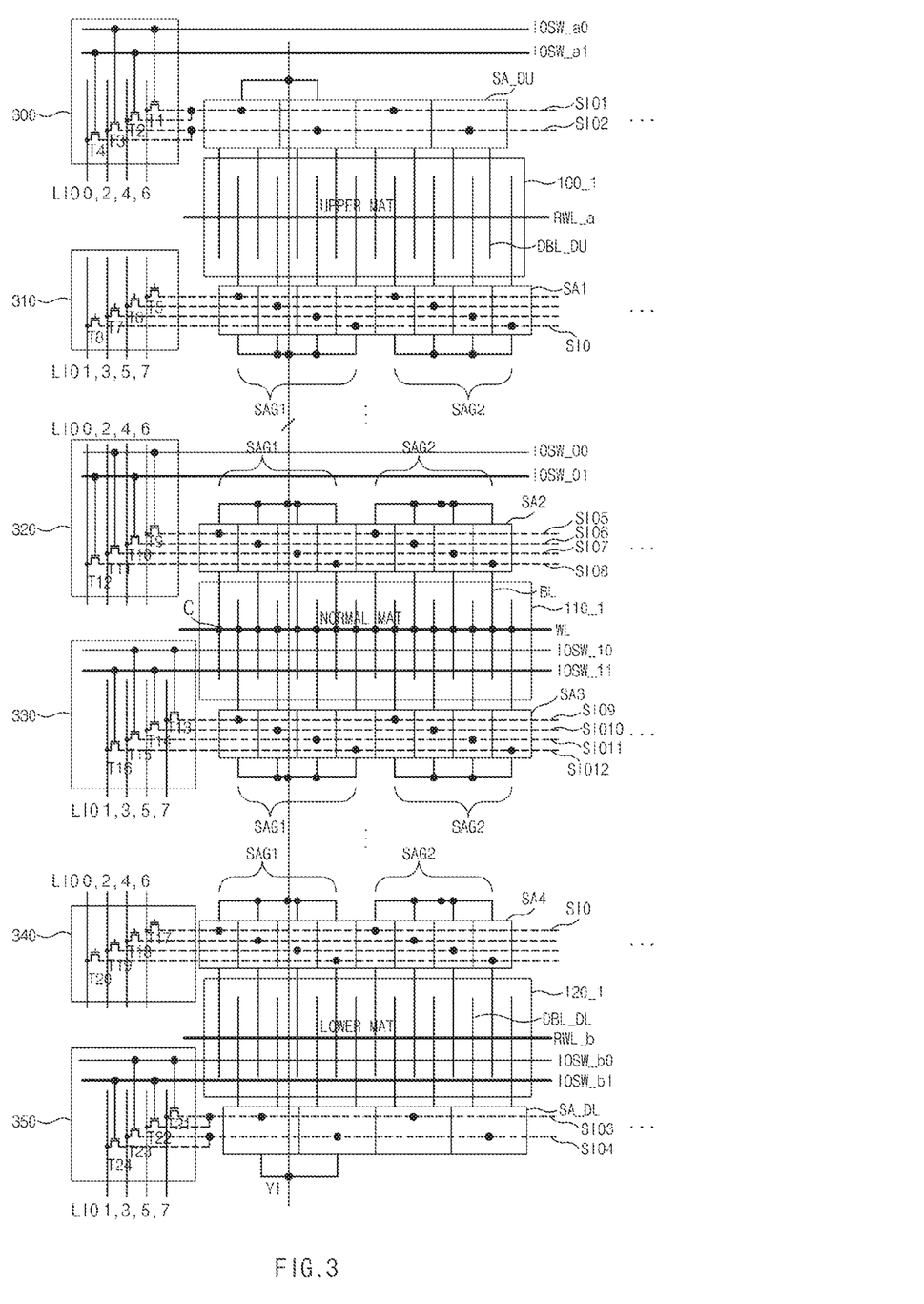
FIG. 3 is a diagram illustrating a representation of an example of the bank illustrated in FIG. 1.

FIG. 3 is a diagram illustrating a representation of an example of the bank BK illustrated in FIG. 1.

Referring to FIG. 3, in an embodiment, the bank BK may include a normal mat 110_1, an upper mat 100_1, a lower mat 120_1, a plurality of sensing circuits SA1 to SA4, a plurality of dummy sensing circuits SA_DU and SA_DL, and a plurality of selection circuits 300 to 350.

The upper mat 100_1 is disposed over the normal mat 110_1, and the lower mat 120_1 is disposed under the normal mat 110_1. The upper mat 100_1 and the lower mat 120_1 correspond to dummy mats which may be formed adjacent to peripheral regions of the normal mat 110_1.

The plurality of sensing circuits SA1 to SA4 may be disposed respectively between mats. For example, the sensing circuit SA1 is formed in a region lying under the upper mat 100_1, and includes a plurality of sense amplifiers. The sensing circuit SA2 is disposed over the normal mat 110_1, and includes a plurality of sense amplifiers. The sensing circuit SA3 is disposed under the normal mat 110_1, and includes a plurality of sense amplifiers. The sensing circuit SA4 is formed in a region lying over the lower mat 120_1, and includes a plurality of sense amplifiers.

It is described in the present embodiment, for the sake of convenience in explanation, that each of the sensing circuits SA2 and SA3 includes 8 sense amplifiers. However, the embodiments are not limited to such, and it is to be noted that each of the sensing circuits SA2 and SA3 may include, for example but not limited to, 512 sense amplifiers to have a bank structure in which total 1K number of sense amplifiers are disposed.

It is set as a reference that 4 segment input/output lines SIO are disposed for the one sensing circuit SA2 and 4 segment input/output lines SIO are disposed for the one sensing circuit SA3. However, the embodiments are not limited to such, and it is to be noted that, for example, in the sensing circuits SA2 and SA3, 128 sense amplifiers may be coupled with each one segment input/output line SIO.

The dummy sensing circuit SA_DU is formed in a region lying over the upper mat 100_1, and includes a plurality of dummy sense amplifiers. The dummy sensing circuit SA_DL is formed in a region lying under the lower mat 120_1, and includes a plurality of dummy sense amplifiers.

The plurality of selection circuits 300 to 350 selectively couple local input/output lines LIO and segment input/output lines SIO by the selection control signals IOSW.

The selection circuits 300, 320 and 340 couple even local input/output lines LIO0, LIO2, LIO4 and LIO6 and segment input/output lines SIO. The selection circuits 310, 330 and 350 couple odd local input/output lines LIO1, LIO3, LIO5 and LIO7 and segment input/output lines SIO.

The selection circuit 300 couples selectively even local input/output lines LIO0, LIO2, LIO4 and LIO6 and the dummy sensing circuit SA_DU by selection control signals IOSW_a0 and IOSW_a1.

The selection circuit 300 includes a plurality of switching elements T1 to T4. The plurality of switching elements T1 to T4 are coupled between the even local input/output lines LIO0, LIO2, LIO4 and LIO6 and segment input/output lines SIO1 and SIO2 of the dummy sensing circuit SA_DU, and are applied with the selection control signals IOSW_a0 and IOSW_a1 through the gate terminals thereof.

The group of the switching elements T1 and T3 are controlled by the selection control signal IOSW_a0, and selectively couple the local input/output lines LIO2 and LIO6 and the segment input/output lines SIO1 and SIO2.

The group of the switching elements T2 and T4 are controlled by the selection control signal IOSW_a1, and selectively couple the local input/output lines LIO0 and LIO4 and the segment input/output lines SIO1 and SIO2.

The selection circuit 350 couples selectively odd local input/output lines LIO1, LIO3, LIO5 and LIO7 and the dummy sensing circuit SA_DL by selection control signals IOSW_b0 and IOSW_b1.

The selection circuit 350 includes a plurality of switching elements T21 to T24. The plurality of switching elements T21 to T24 are coupled between the odd local input/output lines LIO1, LIO3, LIO5 and LIO7 and segment input/output lines SIO3 and SIO4 of the dummy sensing circuit SA_DL, and are applied with the selection control signals IOSW_b0 and IOSW_b1 through the gate terminals thereof.

The group of the switching elements T21 and T23 are controlled by the selection control signal IOSW_b0, and selectively couple the local input/output lines LIO3 and LIO7 and the segment input/output lines SIO3 and SIO4. The group of the switching elements T22 and T24 are controlled by the selection control signal IOSW_b1, and selectively couple the local input/output lines LIO1 and LIO5 and the segment input/output lines SIO3 and SIO4.

The selection circuit 320 couples selectively even local input/output lines LIO0, LIO2, LIO4 and LIO6 and the sensing circuit SA2 by selection control signals IOSW_00 and IOSW_01. The selection circuit 320 includes a plurality of switching elements T9 to T12. The plurality of switching elements T9 to T12 are coupled between the even local input/output lines LIO0, LIO2, LIO4 and LIO6 and segment input/output lines SIO5 to SIO8 of the sensing circuit SA2, and are applied with the selection control signals IOSW_00 and IOSW_01 through the gate terminals thereof.

The group of the switching elements T9 and T11 are controlled by the selection control signal IOSW_00, and selectively couple the local input/output lines LIO2 and LIO6 and the segment input/output lines SIO5 and SIO7. The group of the switching elements T10 and T12 are controlled by the selection control signal IOSW_01, and selectively couple the local input/output lines LIO0 and LIO4 and the segment input/output lines SIO6 and SIO8.

The selection circuit 330 couples selectively odd local input/output lines LIO1, LIO3, LIO5 and LIO7 and the sensing circuit SA3 by selection control signals IOSW_10 and IOSW_11. The selection circuit 330 includes a plurality of switching elements T13 to T16. The plurality of switching elements T13 to T16 are coupled between the odd local input/output lines LIO1, LIO3, LIO5 and LIO7 and segment input/output lines SIO9 to SIO12 of the sensing circuit SA3, and are applied with the selection control signals IOSW_10 and IOSW_11 through the gate terminals thereof.

The group of the switching elements T13 and T15 are controlled by the selection control signal IOSW_10, and selectively couple the local input/output lines LIO3 and LIO7 and the segment input/output lines SIO9 and SIO11. The group of the switching elements T14 and T16 are controlled by the selection control signal IOSW_11, and selectively couple the local input/output lines LIO1 and LIO5 and the segment input/output lines SIO10 and SIO12.

In the upper mat 100_1, dummy cells are formed at points where a redundancy word line RWL_a and dummy bit lines DBL_DU intersect. Each one sense amplifier of the dummy sensing circuit SA_DU is coupled with 2 dummy bit lines DBL_DU. In the case where 2 dummy bit lines DBL_DU are coupled with each one sense amplifier, the number of sense amplifiers may be reduced in half when compared to a conventional structure.

In the lower mat 120_1, dummy cells are formed at points where a redundancy word line RWL_b and dummy bit lines DBL_DL intersect. Each one sense amplifier of the dummy sensing circuit SA_DL is coupled with 2 dummy bit lines DBL_DL. In the case where 2 dummy bit lines DBL_DL are coupled with each one sense amplifier, the number of sense amplifiers may be reduced in half when compared to the conventional structure.

In the normal mat 110_1, cells C are formed at points where a word line WL and bit lines BL intersect. Each one sense amplifier of the sensing circuit SA2 is coupled with one bit line BL. Similarly, each one sense amplifier of the sensing circuit SA3 is coupled with one bit line BL.

For example, the upper mat 100_1 is coupled with 4 sense amplifiers of the dummy sensing circuit SA_DU and is coupled with 8 sense amplifiers of the sensing circuit SA1. In other words, the dummy sensing circuit SA_DU which is coupled with the upper mat 100_1 has sense amplifiers the number of which corresponds to half the number of the sense amplifiers of the sensing circuit SA1. The lower mat 120_1 is coupled with 4 sense amplifiers of the dummy sensing circuit SA_DL and is coupled with 8 sense amplifiers of the sensing circuit SA4. In other words, the dummy sensing circuit SA_DL which is coupled with the lower mat 120_1 has sense amplifiers the number of which corresponds to half the number of the sense amplifiers of the sensing circuit SA4.

It was described in the present embodiment, for the sake of convenience in explanation, that the dummy sensing circuit SA_DU includes 4 sense amplifiers and the sensing circuit SA1 includes 8 sense amplifiers. However, the present embodiment or embodiments are not limited to such, and it is to be noted that the dummy sensing circuit SA_DU may include, for example but not limited to, 256 sense amplifiers and the sensing circuit SA1 may include 512 sense amplifiers as a double. Since each one sense amplifier is coupled with 2 dummy bit lines DBL_DU in the upper mat 100_1, 256 sense amplifiers, for example, cannot help but be disposed in the upper mat 100_1.

It is set as a reference that 2 segment input/output lines SIO1 and SIO2 are disposed for the one dummy sensing circuit SA_DU. In the dummy sensing circuit SA_DU, for example, 128 sense amplifiers may be coupled to each one of the segment input/output lines SIO1 and SIO2.

For example, the 2 switching elements T1 and T2 are coupled to the one segment input/output line SIO1, and the 2 switching elements T3 and T4 are coupled to the one segment input/output line SIO2. According to this fact, when the selection control signal IOSW_a0 is enabled, the switching elements T1 and T3 are turned on, and the 2 segment input/output lines SIO1 and SIO2 are simultaneously enabled. When the selection control signal IOSW_a1 is enabled, the switching elements T2 and T4 are turned on, and the 2 segment input/output lines SIO1 and SIO2 are simultaneously enabled. Therefore, sense amplifiers of the dummy sensing circuit SA_DU operate by the same number as the sensing circuit SA1.

Further, it was described in the present embodiment, for the sake of convenience in explanation, that the dummy sensing circuit SA_DL includes 4 sense amplifiers and the sensing circuit SA4 includes 8 sense amplifiers. However, the present embodiment and embodiments are not limited to such, and it is to be noted that the dummy sensing circuit SA_DL may include, for example but not limited to, 256 sense amplifiers and the sensing circuit SA4 may include 512 sense amplifiers as a double. Since each one sense amplifier is coupled with 2 dummy bit lines DBL_DL in the lower mat 120_1, for example, 256 sense amplifiers cannot help but be disposed in the lower mat 120_1.

It is set as a reference that 2 segment input/output lines SIO3 and SIO4 are disposed for the one dummy sensing circuit SA_DL. In the dummy sensing circuit SA_DL, for example, 128 sense amplifiers may be coupled to each one of the segment input/output lines SIO3 and SIO4.

For example, the 2 switching elements T21 and T22 are coupled to the one segment input/output line SIO3, and the 2 switching elements T23 and T24 are coupled to the one segment input/output line SIO4. According to this fact, when the selection control signal IOSW_b0 is enabled, the switching elements T21 and T23 are turned on, and the 2 segment input/output lines SIO3 and SIO4 are simultaneously enabled. When the selection control signal IOSW_b1 is enabled, the switching elements T22 and T24 are turned on, and the 2 segment input/output lines SIO3 and SIO4 are simultaneously enabled. Therefore, sense amplifiers of the dummy sensing circuit SA_DL operate by the same number as the sensing circuit SA4.

A column select signal YI selects column lines of the upper mat 100_1, the normal mat 110_1 and the lower mat 120_1. When the column select signal YI is enabled, all sense amplifiers of the dummy sensing circuit SA_DL coupled with the lower mat 120_1 are selected, and half sense amplifier groups SAG1 of the sensing circuits SA1 to SA4 are selected. For example, in the case where 128 sense amplifiers are coupled to each one segment input/output line SIO in the normal mat 110_1, 128 column select signals YI are needed.

The operation of the repair device in accordance with an embodiment of FIG. 3, configured as mentioned above, will be described below.

First, in the case where a repair operation is not performed, the word line WL is enabled, and all of the selection control signals IOSW_00, IOSW_01, IOSW_10 and IOSW_11 are enabled. If a fail occurs among the cells of the normal mat 110_1, a cell of the normal mat 110_1 in which a fail has occurred is replaced with a cell of the upper mat 100_1 or a cell of the lower mat 120_1.

For example, a case where a fail has occurred in a cell of the normal mat 110_1 corresponding to the local input/output lines LIO0 and LIO4 is assumed. Then, the word line WL and the redundancy word line RWL_a of the upper mat 100_1 are simultaneously enabled. The selection control signal IOSW_00, the selection control signal IOSW_a1 and the selection control signals IOSW_10 and IOSW_11 are enabled.

According to this fact, in the selection circuit 320, the switching elements T9 and T11 are turned on and the segment input/output lines SIO5 and SIO7 are selected, by which the sensing circuit SA2 operates. In the selection circuit 330, the switching elements T13 to T16 are turned on, by which the sensing circuit SA3 operates. In the selection circuit 300, the switching elements T2 and T4 are turned on and the segment input/output lines SIO1 and SIO2 are selected, by which the failed cell of the normal mat 110_1 is replaced with a cell of the upper mat 100_1.

Conversely, a case where a fail has occurred in a cell of the normal mat 110_1 corresponding to the local input/output lines LIO1 and LIO5 is assumed. Then, the word line WL and the redundancy word line RWL_b of the lower mat 120_1 are simultaneously enabled. The selection control signals IOSW_00 and IOSW_01, the selection control signal IOSW_b1 and the selection control signal IOSW_10 are enabled.

According to this fact, in the selection circuit 330, the switching elements T13 and T15 are turned on and the segment input/output lines SIO9 and SIO11 are selected, by which the sensing circuit SA3 operates. In the selection circuit 320, the switching elements T9 to T12 are turned on, by which the sensing circuit SA2 operates. In the selection circuit 350, the switching elements T22 and T24 are turned on and the segment input/output lines SIO3 and SIO4 are selected, by which the failed cell of the normal mat 110_1 is replaced with a cell of the lower mat 120_1.

Figure 4:
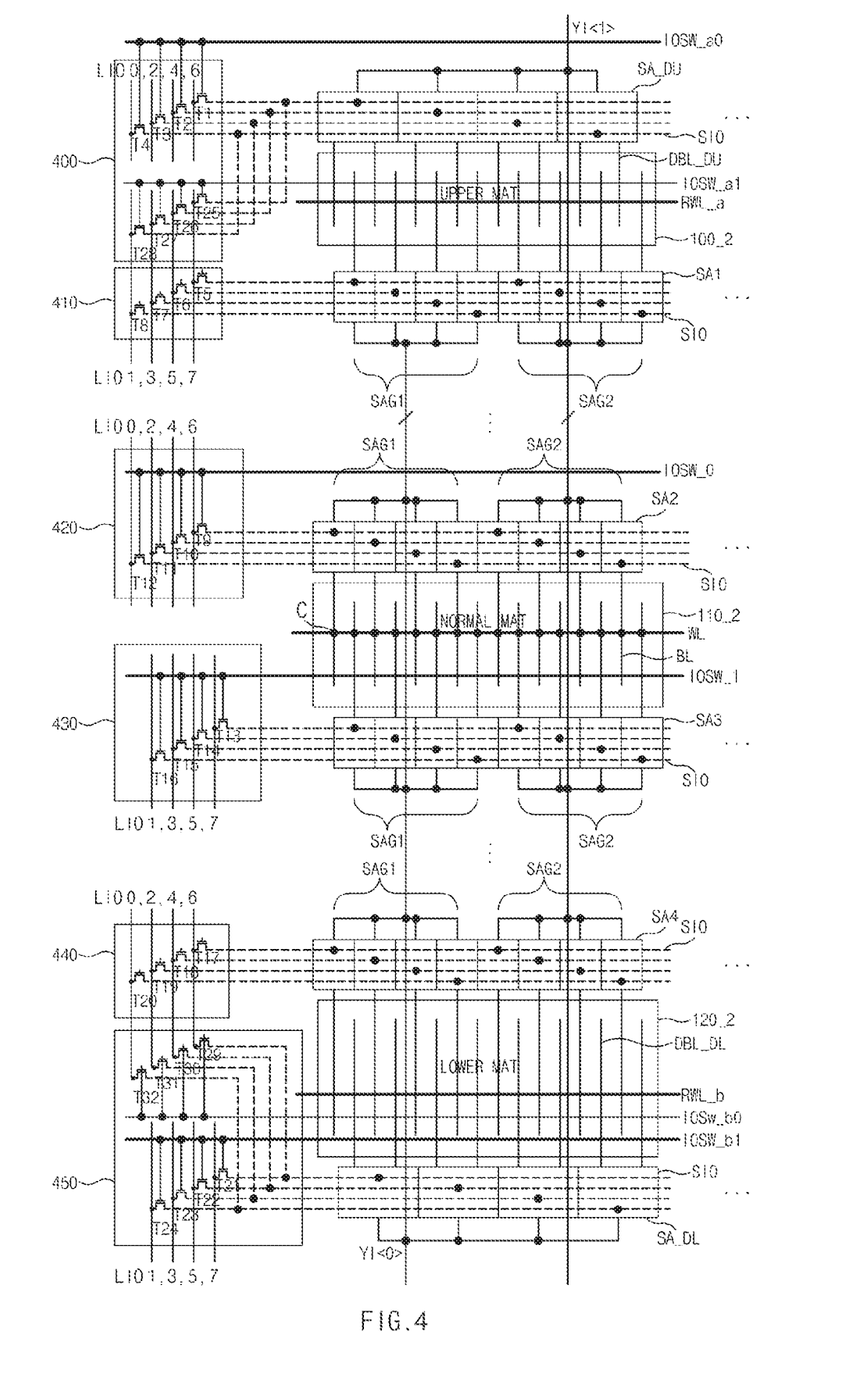
FIG. 4 is a diagram illustrating a representation of an example of the bank illustrated in FIG. 1.

FIG. 4 is a diagram illustrating a representation of an example of the bank BK illustrated in FIG. 1.

Referring to FIG. 4, in an embodiment, the bank BK may include a normal mat 110_2, an upper mat 100_2, a lower mat 120_2, a plurality of sensing circuits SA1 to SA4, a plurality of dummy sensing circuits SA_DU and SA_DL, and a plurality of selection circuits 400 to 450.

The upper mat 100_2 may be disposed over the normal mat 110_2, and the lower mat 120_2 may be disposed under the normal mat 110_2. The upper mat 100_2 and the lower mat 120_2 correspond to dummy mats which may be formed adjacent to peripheral regions of the normal mat 110_2.

The plurality of sensing circuits SA1 to SA4 may be disposed respectively between mats. For example, the sensing circuit SA1 is formed in a region lying under the upper mat 100_2, and includes a plurality of sense amplifiers. The sensing circuit SA2 is disposed over the normal mat 110_2, and includes a plurality of sense amplifiers. The sensing circuit SA3 is disposed under the normal mat 110_2, and includes a plurality of sense amplifiers. The sensing circuit SA4 is formed in a region lying over the lower mat 120_2, and includes a plurality of sense amplifiers.

It is described in the present embodiment, for the sake of convenience in explanation, that each of the sensing circuits SA2 and SA3 includes 8 sense amplifiers. However, the embodiments are not limited to such, and it is to be noted that each of the sensing circuits SA2 and SA3 may include, for example but not limited to, 512 sense amplifiers to have a bank structure in which total 1K number of sense amplifiers are disposed.

It is set as a reference that 4 segment input/output lines SIO are disposed for the one sensing circuit SA2 and 4 segment input/output lines SIO are disposed for the one sensing circuit SA3. In the sensing circuits SA2 and SA3, for example, 128 sense amplifiers may be coupled with each one segment input/output line SIO.

The dummy sensing circuit SA_DU is formed in a region lying over the upper mat 100_2, and includes a plurality of dummy sense amplifiers. The dummy sensing circuit SA_DL is formed in a region lying under the lower mat 120_2, and includes a plurality of dummy sense amplifiers.

The plurality of selection circuits 400 to 450 selectively couple local input/output lines LIO and segment input/output lines SIO by the selection control signals IOSW.

The selection circuits 420 and 440 couple even local input/output lines LIO0, LIO2, LIO4 and LIO6 and segment input/output lines SIO. The selection circuits 410 and 430 couple odd local input/output lines LIO1, LIO3, LIO5 and LIO7 and segment input/output lines SIO. The selection circuits 400 and 450 select even local input/output lines LIO0, LIO2, LIO4 and LIO6 and odd local input/output lines LIO1, LIO3, LIO5 and LIO7, and couple selected local input/output lines with segment input/output lines SIO.

The selection circuit 400 couples selectively even local input/output lines LIO0, LIO2, LIO4 and LIO6 and the dummy sensing circuit SA_DU by a selection control signal IOSW_a0. To this end, the selection circuit 400 includes a group of a plurality of switching elements T1 to T4. The group of the plurality of switching elements T1 to T4 are coupled between the even local input/output lines LIO0, LIO2, LIO4 and LIO6 and the segment input/output lines SIO of the dummy sensing circuit SA_DU, and are applied with the selection control signal IOSW_a0 through the gate terminals thereof.

Further, the selection circuit 400 couples selectively odd local input/output lines LIO1, LIO3, LIO5 and LIO7 and the dummy sensing circuit SA_DU by a selection control signal IOSW_a1. The selection circuit 400 includes a group of a plurality of switching elements T25 to T28. The group of the plurality of switching elements T25 to T28 are coupled between the odd local input/output lines LIO1, LIO3, LIO5 and LIO7 and the segment input/output lines SIO of the dummy sensing circuit SA_DU, and are applied with the selection control signal IOSW_a1 through the gate terminals thereof.

In this way, the selection circuit 400 couples selectively the even local input/output lines LIO0, LIO2, LIO4 and LIO6 and the dummy sensing circuit SA_DU by controlling the group of the plurality of switching elements T1 to T4 by the selection control signal IOSW_a0. Further, the selection circuit 400 couples selectively the odd local input/output lines LIO1, LIO3, LIO5 and LIO7 and the dummy sensing circuit SA_DU by controlling the group of the plurality of switching elements T25 to T28 by the selection control signal IOSW_a1.

The selection circuit 420 couples selectively even local input/output lines LIO0, LIO2, LIO4 and LIO6 and the sensing circuit SA2 by a selection control signal IOSW_0. The selection circuit 420 includes a plurality of switching elements T9 to T12. The plurality of switching elements T9 to T12 are coupled between the even local input/output lines LIO0, LIO2, LIO4 and LIO6 and the segment input/output lines SIO of the sensing circuit SA2, and are applied with the selection control signal IOSW_0 through the gate terminals thereof.

The selection circuit 430 couples selectively odd local input/output lines LIO1, LIO3, LIO5 and LIO7 and the sensing circuit SA3 by a selection control signal IOSW_1. The selection circuit 430 includes a plurality of switching elements T13 to T16. The plurality of switching elements T13 to T16 are coupled between the odd local input/output lines LIO1, LIO3, LIO5 and LIO7 and the segment input/output lines SIO of the sensing circuit SA3, and are applied with the selection control signal IOSW_1 through the gate terminals thereof.

The selection circuit 450 couples selectively even local input/output lines LIO0, LIO2, LIO4 and LIO6 and the dummy sensing circuit SA_DL by a selection control signal IOSW_b0. The selection circuit 450 includes a group of a plurality of switching elements T29 to T32. The group of the plurality of switching elements T29 to T32 are coupled between the even local input/output lines LIO0, LIO2, LIO4 and LIO6 and the segment input/output lines SIO of the dummy sensing circuit SA_DL, and are applied with the selection control signal IOSW_b0 through the gate terminals thereof.

Further, the selection circuit 450 couples selectively odd local input/output lines LIO1, LIO3, LIO5 and LIO7 and the dummy sensing circuit SA_DL by a selection control signal IOSW_b1. The selection circuit 450 includes a group of a plurality of switching elements T21 to T24. The group of the plurality of switching elements T21 to T24 are coupled between the odd local input/output lines LIO1, LIO3, LIO5 and LIO7 and the segment input/output lines SIO of the dummy sensing circuit SA_DL, and are applied with the selection control signal IOSW_b1 through the gate terminals thereof.

In this way, the selection circuit 450 couples selectively the even local input/output lines LIO0, LIO2, LIO4 and LIO6 and the dummy sensing circuit SA_DL by controlling the group of the plurality of switching elements T29 to T32 by the selection control signal IOSW_b0. Further, the selection circuit 450 couples selectively the odd local input/output lines LIO1, LIO3, LIO5 and LIO7 and the dummy sensing circuit SA_DL by controlling the group of the plurality of switching elements T21 to T24 by the selection control signal IOSW_b1.

In the upper mat 100_2, dummy cells are formed at points where a redundancy word line RWL_a and dummy bit lines DBL_DU intersect. Each one sense amplifier of the dummy sensing circuit SA_DU is coupled with 2 dummy bit lines DBL_DU. In the case where 2 dummy bit lines DBL_DU are coupled with each one sense amplifier, the number of sense amplifiers may be reduced in half when compared to a conventional structure.

In the lower mat 120_2, dummy cells are formed at points where a redundancy word line RWL_b and dummy bit lines DBL_DL intersect. Each one sense amplifier of the dummy sensing circuit SA_DL is coupled with 2 dummy bit lines DBL_DL. In the case where 2 dummy bit lines DBL_DL are coupled with each one sense amplifier, the number of sense amplifiers may be reduced in half when compared to the conventional structure.

In the normal mat 110_2, cells C are formed at points where a word line WL and bit lines BL intersect. Each one sense amplifier of the sensing circuit SA2 is coupled with one bit line BL. Similarly, each one sense amplifier of the sensing circuit SA3 is coupled with one bit line BL.

For example, the upper mat 100_2 is coupled with 4 sense amplifiers of the dummy sensing circuit SA_DU and is coupled with 8 sense amplifiers of the sensing circuit SA1. In other words, the dummy sensing circuit SA_DU which is coupled with the upper mat 100_2 has sense amplifiers the number of which corresponds to half the number of the sense amplifiers of the sensing circuit SA1. The lower mat 120_2 is coupled with 4 sense amplifiers of the dummy sensing circuit SA_DL and is coupled with 8 sense amplifiers of the sensing circuit SA4. In other words, the dummy sensing circuit SA_DL which is coupled with the lower mat 120_2 has sense amplifiers the number of which corresponds to half the number of the sense amplifiers of the sensing circuit SA4.

It was described in the present embodiment, for the sake of convenience in explanation, that the dummy sensing circuit SA_DU includes 4 sense amplifiers and the sensing circuit SA1 includes 8 sense amplifiers. However, the present embodiments and embodiments are not limited to such, and it is to be noted that the dummy sensing circuit SA_DU may include, for example but not limited to, 256 sense amplifiers and the sensing circuit SA1 may include 512 sense amplifiers as a double. Since each one sense amplifier is coupled with 2 dummy bit lines DBL_DU in the upper mat 100_2, 256 sense amplifiers cannot help but be disposed in the upper mat 100_2.

It is set as a reference that 4 segment input/output lines SIO are disposed for the one dummy sensing circuit SA_DU. In the dummy sensing circuit SA_DU, for example, 64 sense amplifiers may be coupled to each one segment input/output line SIO.

Further, it was described in the present embodiment, for the sake of convenience in explanation, that the dummy sensing circuit SA_DL includes 4 sense amplifiers and the sensing circuit SA4 includes 8 sense amplifiers. However, the present embodiments and embodiments are not limited to such, and it is to be noted that the dummy sensing circuit SA_DL may include, for example but not limited to, 256 sense amplifiers and the sensing circuit SA4 may include 512 sense amplifiers as a double. Since each one sense amplifier is coupled with 2 dummy bit lines DBL_DL in the lower mat 120_2, 256 sense amplifiers cannot help but be disposed in the lower mat 120_2.

It is set as a reference that 4 segment input/output lines SIO are disposed for the one dummy sensing circuit SA_DL. In the dummy sensing circuit SA_DL, for example, 64 sense amplifiers may be coupled to each one segment input/output line SIO.

A column select signal YI<0> selects column lines of the upper mat 100_2, the normal mat 110_2 and the lower mat 120_2. When the column select signal YI<0> is enabled, all sense amplifiers of the dummy sensing circuit SA_DL coupled with the lower mat 120_2 are selected, and half sense amplifier groups SAG1 of the sensing circuits SA1 to SA4 are selected. Conversely, when a column select signal YI<1> is enabled, all sense amplifiers of the dummy sensing circuit SA_DU coupled with the upper mat 100_2 are selected, and half sense amplifier groups SAG2 of the sensing circuits SA1 to SA4 are selected.

For example, in the case where 128 sense amplifiers are coupled to each one segment input/output line SIO in the normal mat 110_2, 128 column select signals YI are needed. Conversely, in the case where 64 sense amplifiers are coupled to each one segment input/output line SIO in the upper mat 100_2 and the lower mat 120_2, 64 column select signals YI are needed. Namely, in the case of the upper mat 100_2 and the lower mat 120_2, every other one of the dummy bit lines DBL_DU and DBL_DL is coupled with an application line of a column select signal YI.

The operation of the repair device in accordance with an embodiment of FIG. 4, configured as mentioned above, will be described below.

First, in the case where a repair operation is not performed, the word line WL is enabled, and both the selection control signals IOSW_0 and IOSW_1 are enabled. If a fail occurs among the cells of the normal mat 110_2, a cell of the normal mat 110_2 in which a fail has occurred is replaced with a cell of the upper mat 100_2 or a cell of the lower mat 120_2.

For example, a case where a fail has occurred in a cell of the normal mat 110_2 corresponding to the local input/output line LIO0 on the column select signal YI<0> is assumed. Then, the word line WL and the redundancy word line RWL_b of the lower mat 120_2 are simultaneously enabled. The selection control signal IOSW_1 and the selection control signal IOSW_b0 are enabled.

According to this fact, the selection circuit 430 is turned on, the segment input/output lines SIO are selected, and the sensing circuit SA3 operates. In the selection circuit 450, the switching elements T29 to T32 are turned on, by which the dummy sensing circuit SA_DL operates. As the switching elements T29 to T32 are turned on, the segment input/output lines SIO of the dummy sensing circuit SA_DL are coupled with the even local input/output lines LIO0, LIO2, LIO4 and LIO6, and repair is performed by the redundancy cells of the lower mat 120_2.

In this way, when a fail has occurred in the even local input/output line LIO0, data of the odd local input/output lines LIO1, LIO3, LIO5 and LIO7 are sensed in the normal mat 110_2, and data of the even local input/output lines LIO0, LIO2, LIO4 and LIO6 are sensed in the lower mat 120_2.

Figure 5:
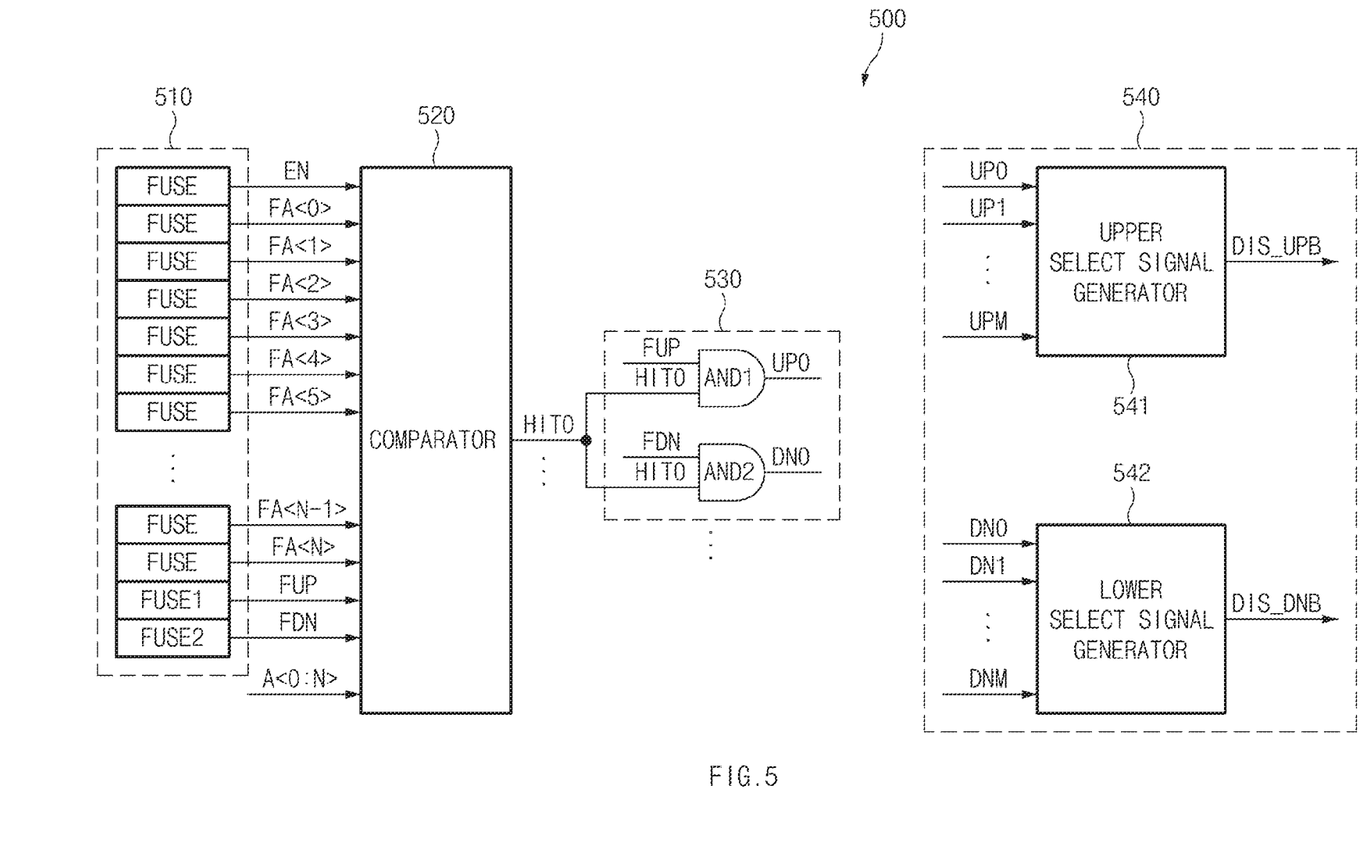
FIG. 5 is a configuration diagram illustrating a representation of an example of the selection controller illustrated in FIG. 1.

FIG. 5 is a configuration diagram illustrating a representation of an example of the selection controller 500 illustrated in FIG. 1. While the selection controller 500 illustrated in FIG. 5 may be applied to all of FIGS. 2 to 4, in an embodiment, it will be described as an example that the selection controller 500 illustrated in FIG. 5 is applied to FIG. 2.

The selection controller 500 generates the upper select signal DIS_UPB and the lower select signal DIS_DNB for selectively enabling the plurality of selection control signals IOSW in the embodiments of FIG. 1.

The selection controller 500 may include a fuse circuit 510, a comparator 520, a control signal generation circuit 530, and a select signal generator 540. The fuse circuit 510 includes a plurality of fuses FUSE which store fail address information. In the present embodiment, the fuse circuit 510 may be configured by an array E-fuse (ARE) in which fuse sets are arranged in the form of an array.

The plurality of fuses FUSE generate an enable signal EN and a fuse address FA<0:N> which represents a fail address. Two fuses FUSE1 and FUSE2 among the plurality of fuses FUSE store fail information regarding in which region between an upper region and a lower region of a corresponding mat a fail has occurred.

For example, in the case where a fail has occurred in an upper region, the fuse FUSE1 is cut, and an upper signal FUP is enabled. In the case where a fail has occurred in a lower region, the fuse FUSE2 is cut, and a lower signal FDN is enabled. In the case where fails have occurred in both an upper region and a lower region, the fuses FUSE1 and FUSE2 are cut, and both the upper signal FUP and the lower signal FDN are enabled.

The comparator 520 compares the fuse address FA<0:N> and the normal address A<0:N> and outputs a comparison signal HIT0, when the enable signal EN is enabled. The comparator 520 compares the fuse address FA<0:N> and the normal address A<0:N>, and enables the comparison signal HIT0 when the two addresses match each other.

The control signal generation circuit 530 combines the upper signal FUP and the lower signal FDN with the comparison signal HIT0, and generates an upper control signal UP0 and a lower control signal DN0. The control signal generation circuit 530 includes logic gates. For example, the control signal generation circuit 530 may include AND gates AND1 and AND2. The AND gate AND1 ANDs or performs an AND logic function on the upper signal FUP and the comparison signal HIT0, and outputs the upper control signal UP0. The AND gate AND2 ANDs or performs an AND logic function on the lower signal FDN and the comparison signal HIT0, and outputs the lower control signal DN0.

The select signal generator 540 combines upper control signals UP0 to UPM and lower control signals DN0 to DNM, and generates the upper select signal DIS_UPB and the lower select signal DIS_DNB. The select signal generator 540 includes an upper select signal generator 541 and a lower select signal generator 542.

The upper select signal generator 541 combines the upper control signals UP0 to UPM, and generates the upper select signal DIS_UPB. The upper select signal generator 541 enables the upper select signal DIS_UPB in the case where at least any one upper control signal among the upper control signals UP0 to UPM is enabled. The lower select signal generator 542 enables the lower select signal DIS_DNB in the case where at least any one lower control signal among the lower control signals DN0 to DNM is enabled.

For example, if the upper select signal DIS_UPB is enabled, a selection control signal IOSW for controlling switches of an upper region is disabled. Conversely, if the lower select signal DIS_DNB is enabled, a selection control signal IOSW for controlling switches of a lower region is disabled.

Figure 6:
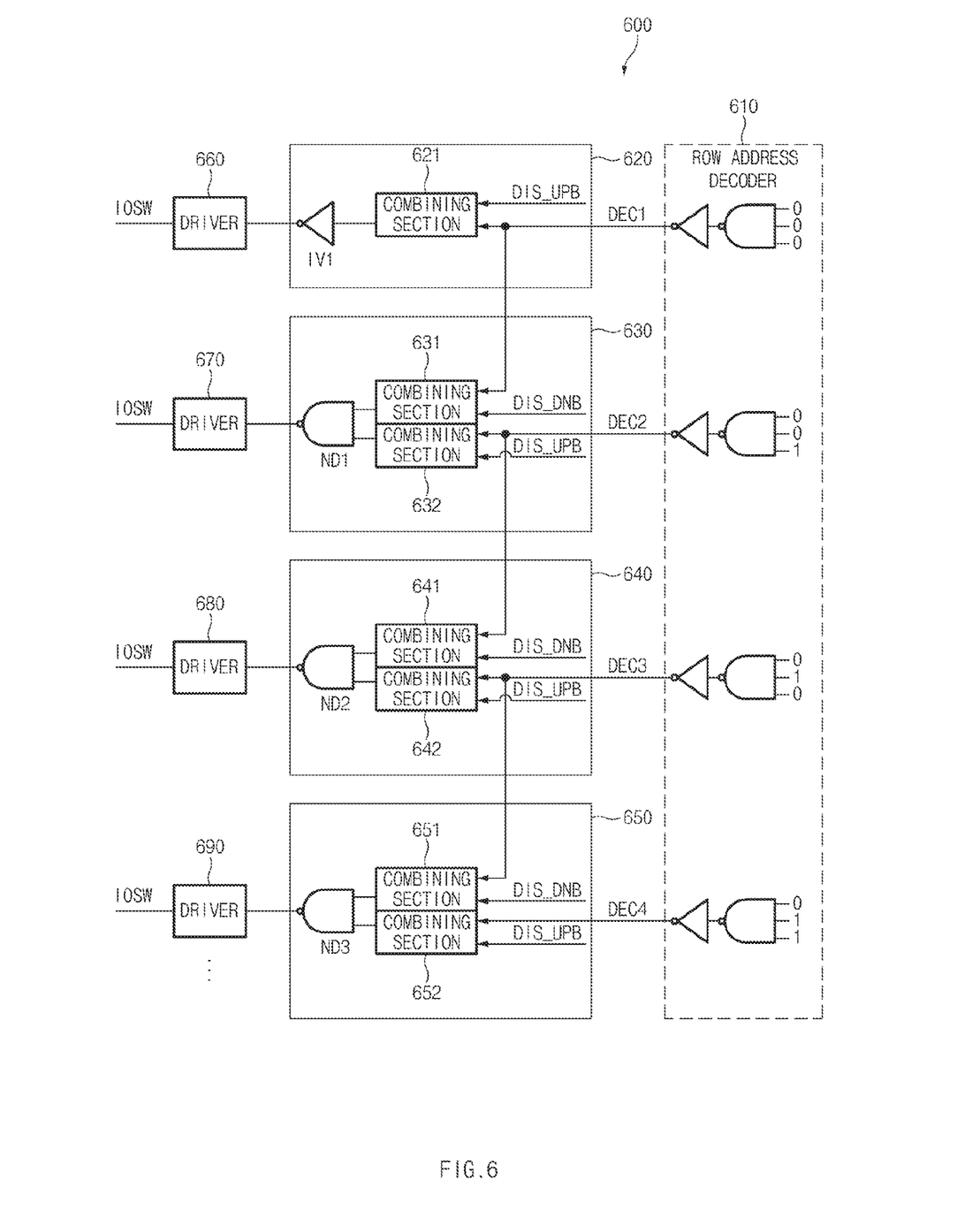
FIG. 6 is a configuration diagram illustrating a representation of an example of the driving controller illustrated in FIG. 1.

FIG. 6 is a configuration diagram illustrating a representation of an example of the driving controller 600 illustrated in FIG. 1.

The driving controller 600 selectively controls enable states of the plurality of selection control signals IOSW in correspondence to the upper select signal DIS_UPB and the lower select signal DIS_DNB applied from the selection controller 500 of FIG. 5.

The driving controller 600 may include a row address decoder 610, input circuits 620 to 650, and drivers 660 to 690. The row address decoder 610 decodes row addresses inputted thereto, and outputs decoding signals DEC1 to DEC4 to the input circuits 620 to 650. The input circuits 620 to 650 combine the outputs of the row address decoder 610, the upper select signal DIS_UPB and the lower select signal DIS_DNB, and output resultant signals.

For example, the input circuit 620 includes a combining section 621 which combines the decoding signal DEC1 and the upper select signal DIS_UPB, and an inverter IV1. The input circuit 630 includes combining sections 631 and 632 which combine the decoding signals DEC1 and DEC2, the upper select signal DIS_UPB and the lower select signal DIS_DNB, and a NAND gate ND1.

The input circuit 640 includes combining sections 641 and 642 which combine the decoding signals DEC2 and DEC3, the upper select signal DIS_UPB and the lower select signal DIS_DNB, and a NAND gate ND2. The input circuit 650 includes combining sections 651 and 652 which combine the decoding signals DEC3 and DEC4, the upper select signal DIS_UPB and the lower select signal DIS_DNB, and a NAND gate ND3.

The drivers 660 to 690 drive the outputs of the input circuits 620 to 650, and selectively control enable states of the plurality of selection control signals IOSW.

In this way, in the driving controller 600 in accordance with the present embodiments, the upper select signal DIS_UPB and the lower select signal DIS_DNB are applied in correspondence to the respective input circuits 620 to 650. For example, it is assumed that the decoding signal DEC2 is enabled. Then, the combining section 632 and the driver 670 may be enabled in correspondence to the upper select signal DIS_UPB, and the combining section 641 and the driver 680 may be disabled in correspondence to the lower select signal DIS_DNB.

The repair devices discussed above (see FIGS. 1-6) are particular useful in the design of memory devices, processors, and computer systems. For example, referring to FIG. 7, a block diagram of a system employing a repair device in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

Figure 7:
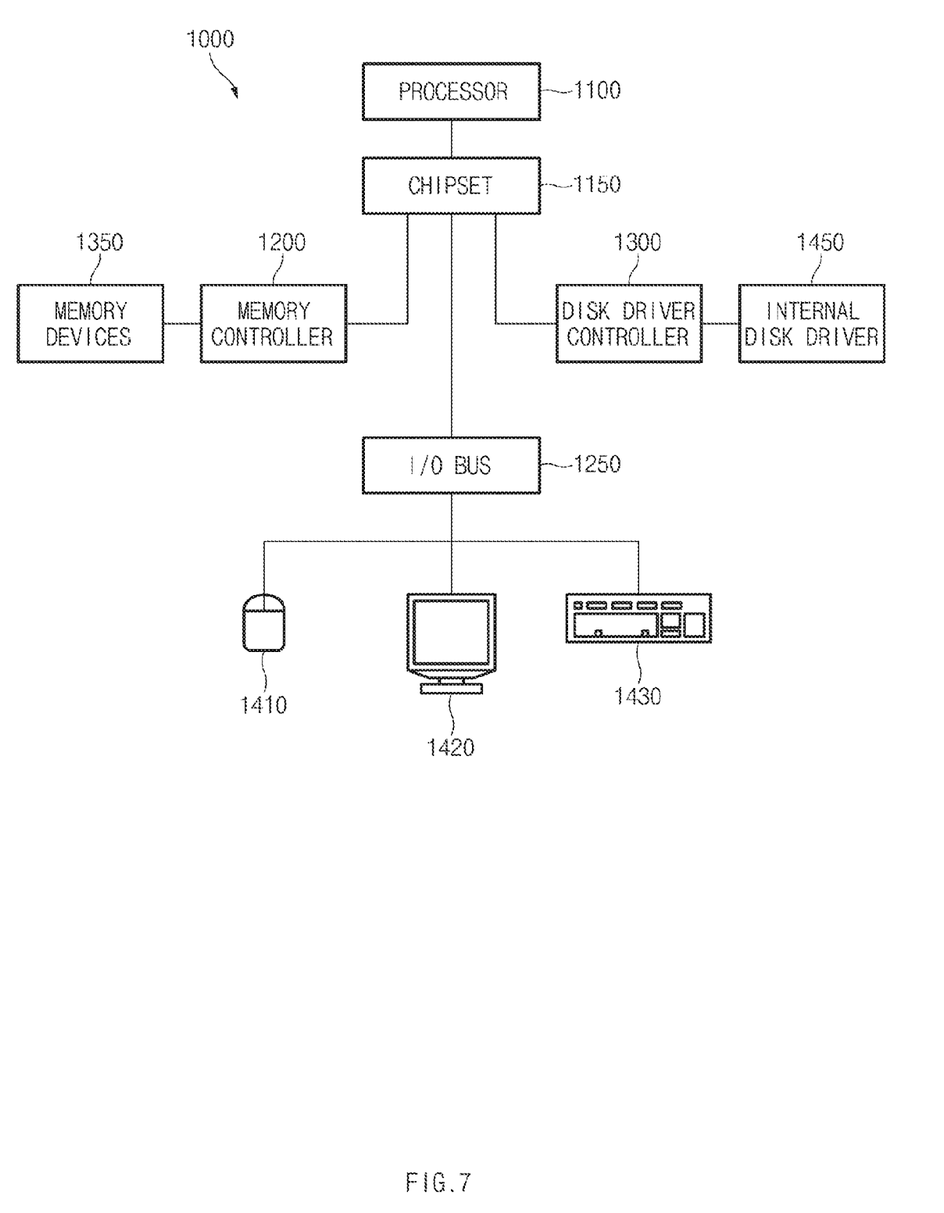
FIG. 7 illustrates a block diagram of an example of a representation of a system employing a repair device in accordance with the various embodiments discussed above with relation to FIGS. 1-6.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one repair device as discussed above with reference to FIGS. 1-6. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one repair device as discussed above with relation to FIGS. 1-6, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 7 is merely one example of a system 1000 employing a repair device as discussed above with relation to FIGS. 1-6. In alternate embodiments, such as, for example but not limited to, cellular phones or digital cameras, the components may differ from the embodiments illustrated in FIG. 7.

While various embodiments have been described above, it will be understood to those skilled in the art that the embodiments described are by way of example only. Accordingly, the repair device described herein should not be limited based on the described embodiments.

What is claimed is:

1. A repair device comprising:
   a bank configured to comprise an upper mat and a lower mat formed adjacent to a normal mat;
   a selection controller configured to control an upper select signal and a lower select signal in correspondence to a fail address and an upper signal and a lower signal which represent a failed region of the normal mat; and
   a driving controller configured to selectively control a selection control signal in correspondence to the upper select signal and the lower select signal,
   wherein the bank selectively couple local input/output lines and a sensing circuit of a corresponding mat in correspondence to the selection control signal, and replace a failed cell of the normal mat with a dummy cell of the upper mat or the lower mat in correspondence to a column select signal.

2. The repair device according to claim 1, wherein the bank comprises:
   the normal mat coupled between a first sensing circuit and a second sensing circuit, and configured to be enabled by a word line;
   the upper mat formed in a region over the normal mat, coupled with a first dummy sensing circuit, and configured to be enabled by a first redundancy word line;
   the lower mat formed in a region under the normal mat, coupled with a second dummy sensing circuit, and configured to be enabled by a second redundancy word line; and
   a plurality of selection circuits configured to selectively couple even local input/output lines or odd local input/output lines with the first sensing circuit, the second sensing circuit, the first dummy sensing circuit and the second dummy sensing circuit in correspondence to the selection control signal.

3. The repair device according to claim 2,
   wherein, in the first dummy sensing circuit, each sense amplifier is coupled with 2 bit lines of the upper mat, and
   wherein, in the second dummy sensing circuit, each sense amplifier is coupled with 2 bit lines of the lower mat.

4. The repair device according to claim 2,
   wherein the first dummy sensing circuit comprises sense amplifiers the number of which corresponds to half the number of sense amplifiers of the first sensing circuit, and
   wherein the second dummy sensing circuit comprises sense amplifiers the number of which corresponds to half the number of sense amplifiers of the second sensing circuit.

5. The repair device according to claim 2, wherein the plurality of selection circuits comprise:
   a first selection circuit configured to selectively couple the first dummy sensing circuit and the even local input/output lines in response to a first selection control signal;
   a second selection circuit configured to selectively couple the first sensing circuit and the even local input/output lines in response to a second selection control signal;
   a third selection circuit configured to selectively couple the second sensing circuit and the odd local input/output lines in response to a third selection control signal; and
   a fourth selection circuit configured to selectively couple the second dummy sensing circuit and the odd local input/output lines in response to a fourth selection control signal.

6. The repair device according to claim 5, wherein, as a first column select signal is enabled, the third selection circuit operates and the odd local input/output lines are coupled with the second sensing circuit when the third selection control signal is enabled, and the first selection circuit operates and the even local input/output lines are coupled with the first dummy sensing circuit when the first selection control signal is enabled, by which a partial amount of sense amplifiers of the first sensing circuit and the first dummy sensing circuit operate such that a failed cell of the normal mat is replaced with a dummy cell of the upper mat.

7. The repair device according to claim 5, wherein, as a second column select signal is enabled, the second selection circuit operates and the even local input/output lines are coupled with the first sensing circuit when the second selection control signal is enabled, and the fourth selection circuit operates and the odd local input/output lines are coupled with the second dummy sensing circuit when the fourth selection control signal is enabled, by which a partial amount of sense amplifiers of the second sensing circuit and the second dummy sensing circuit operate such that a failed cell of the normal mat is replaced with a dummy cell of the lower mat.

8. The repair device according to claim 2,
wherein the first dummy sensing circuit comprises segment input/output lines the number of which corresponds to half the number of segment input/output lines of the first sensing circuit, and
wherein the second dummy sensing circuit comprises segment input/output lines the number of which corresponds to half the number of segment input/output lines of the second sensing circuit.

9. The repair device according to claim 2, wherein the plurality of selection circuits comprise:
a fifth selection circuit configured to selectively couple the first dummy sensing circuit and the even local input/output lines in response to fifth and sixth selection control signals;
a sixth selection circuit configured to selectively couple the first sensing circuit and the even local input/output lines in response to seventh and eighth selection control signals;
a seventh selection circuit configured to selectively couple the second sensing circuit and the odd local input/output lines in response to ninth and tenth selection control signals; and
an eight selection circuit configured to selectively couple the second dummy sensing circuit and the odd local input/output lines in response to eleventh and twelfth selection control signals.

10. The repair device according to claim 9, wherein the fifth selection circuit comprises:
a first group of switching elements configured to couple a partial amount of lines of the even local input/output lines with the segment input/output lines of the first dummy sensing circuit in response to the fifth selection control signal; and
a second group of switching elements configured to couple the remaining amount of lines of the even local input/output lines with the segment input/output lines of the first dummy sensing circuit in response to the sixth selection control signal.

11. The repair device according to claim 9, wherein the sixth selection circuit comprises:
a third group of switching elements configured to couple a partial amount of lines of the even local input/output lines with the segment input/output lines of the first sensing circuit in response to the seventh selection control signal; and
a fourth group of switching elements configured to couple the remaining amount of lines of the even local input/output lines with the segment input/output lines of the first sensing circuit in response to the eighth selection control signal.

12. The repair device according to claim 9, wherein the seventh selection circuit comprises:
a fifth group of switching elements configured to couple a partial amount of lines of the odd local input/output lines with the segment input/output lines of the second sensing circuit in response to the ninth selection control signal; and
a sixth group of switching elements configured to couple the remaining amount of lines of the odd local input/output lines with the segment input/output lines of the second sensing circuit in response to the tenth selection control signal.

13. The repair device according to claim 9, wherein the eighth selection circuit comprises:
a seventh group of switching elements configured to couple a partial amount of lines of the odd local input/output lines with the segment input/output lines of the second dummy sensing circuit in response to the eleventh selection control signal; and
an eighth group of switching elements configured to couple the remaining amount of lines of the odd local input/output lines with the segment input/output lines of the second dummy sensing circuit by being controlled by the twelfth selection control signal.

14. The repair device according to claim 9, wherein, in a repair operation for the even local input/output lines, the word line and the first redundancy word line are enabled, and the sixth selection control signal, the seventh selection control signal, the ninth selection control signal and the tenth selection control signal are enabled such that a dummy cell of the upper mat is used.

15. The repair device according to claim 9, wherein, in a repair operation for the odd local input/output lines, the word line and the second redundancy word line are enabled, and the seventh selection control signal, the eighth selection control signal, the ninth selection control signal and the twelfth selection control signal are enabled such that a dummy cell of the lower mat is used.

16. The repair device according to claim 2, wherein the plurality of selection circuits comprise:
a ninth selection circuit configured to selectively couple the first dummy sensing circuit and the even local input/output lines or the odd local input/output lines in response to thirteenth and fourteenth selection control signals;
a tenth selection circuit configured to selectively couple the first sensing circuit and the even local input/output lines in response to a fifteenth selection control signal;
an eleventh selection circuit configured to selectively couple the second sensing circuit and the odd local input/output lines in response to a sixteenth selection control signal; and
a twelfth selection circuit configured to selectively couple the second dummy sensing circuit and the even local input/output lines or the odd local input/output lines in response to seventeenth and eighteenth selection control signals.

17. The repair device according to claim 16, wherein the ninth selection circuit comprises:

a ninth group of switching elements configured to couple the even local input/output lines with the segment input/output lines of the first dummy sensing circuit in response to the thirteenth selection control signal; and a tenth group of switching elements configured to couple the odd local input/output lines with the segment input/output lines of the first dummy sensing circuit in response to the fourteenth selection control signal.

18. The repair device according to claim 16, wherein the twelfth selection circuit comprises:
    an eleventh group of switching elements configured to couple the even local input/output lines with the segment input/output lines of the second dummy sensing circuit in response to the seventeenth selection control signal; and
    a twelfth group of switching elements configured to couple the odd local input/output lines with the segment input/output lines of the second dummy sensing circuit in response to the eighteenth selection control signal.

19. The repair device according to claim 1, wherein the selection controller comprises:
    a fuse circuit configured to store information on the fail address, the upper signal and the lower signal;
    a comparator configured to compare the fail address and a normal address, and output a comparison signal in correspondence to the upper signal and the lower signal;
    a control signal generation circuit configured to combine the upper signal, the lower signal and the comparison signal, and generate an upper control signal and a lower control signal; and
    a select signal generator configured to combine the upper control signal and the lower control signal, and control the upper select signal and the lower select signal.

20. The repair device according to claim 1, wherein the driving controller comprises:
    a row address decoder configured to decode row addresses and output a plurality of decoding signals;
    input circuits configured to combine the plurality of decoding signals, the upper select signal and the lower select signal; and
    drivers configured to drive output signals of the input circuits, and control the selection control signals.

* * * * *